(12) United States Patent
Moon et al.

(10) Patent No.: US 11,651,960 B2
(45) Date of Patent: May 16, 2023

(54) METHOD FOR FORMING AMORPHOUS SILICON THIN FILM, METHOD FOR MANUFACTURING SEMICONDUCTOR DEVICE INCLUDING SAME, AND SEMICONDUCTOR MANUFACTURED THEREBY

(71) Applicant: WONIK IPS CO., LTD., Pyeongtaek-si Gyeonggi-do (KR)

(72) Inventors: Jae Jung Moon, Suwon-si Gyeonggi-do (KR); Young Chul Choi, Hwaseong-si Gyeonggi-do (KR); Dong Hak Kim, Hwaseong-si Gyeonggi-do (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 44 days.

(21) Appl. No.: 17/350,951

(22) Filed: Jun. 17, 2021

(65) Prior Publication Data

US 2021/0398802 A1 Dec. 23, 2021

(30) Foreign Application Priority Data

Jun. 19, 2020 (KR) .................. 10-2020-0075232

(51) Int. Cl.
*H01L 21/02* (2006.01)
(52) U.S. Cl.
CPC ...... *H01L 21/0262* (2013.01); *H01L 21/0245* (2013.01); *H01L 21/0257* (2013.01); *H01L 21/02502* (2013.01); *H01L 21/02532* (2013.01); *H01L 21/02488* (2013.01); *H01L 21/02592* (2013.01)

(58) Field of Classification Search
None
See application file for complete search history.

(56) References Cited

U.S. PATENT DOCUMENTS

| | | | | |
|---|---|---|---|---|
| 5,321,536 A | * | 6/1994 | Ishii | .............. G02F 1/135 349/25 |
| 5,945,241 A | * | 8/1999 | Niino | .............. G03G 5/14704 430/133 |
| 2009/0009677 A1 | | 1/2009 | Yamazaki et al. | |

FOREIGN PATENT DOCUMENTS

| JP | H06138480 A | * | 5/1994 |
|---|---|---|---|
| TW | 202020537 A | | 6/2020 |

OTHER PUBLICATIONS

Machine-generated English translation of JPH06138480A, total pages 7 (Year: 1994).*

* cited by examiner

*Primary Examiner* — Bo B Jang
(74) *Attorney, Agent, or Firm* — William Park & Associates Ltd.

(57) ABSTRACT

The present invention relates to a method for forming an amorphous silicon thin film, a method for manufacturing a semiconductor device including the same, and a semiconductor device manufactured thereby. The present invention discloses a method for forming an amorphous silicon thin film, wherein the method includes a first step (S10) of providing a first gas containing silicon and a second gas containing nitrogen on a substrate (100) to form a first amorphous silicon layer (310b), and a second step (S20) of providing a first gas containing silicon on the substrate (100) having the first amorphous silicon layer (310b) formed thereon to form a second amorphous silicon layer (300a).

8 Claims, 10 Drawing Sheets

FIG. 5

| a second gas(NH$_3$) / a first gas(SiH$_4$) (%) | R.I (633) |
|---|---|
| 0% | 4.308 |
| 5% | 4.135 |
| 10% | 4.001 |
| 20% | 3.782 |

METHOD FOR FORMING AMORPHOUS SILICON THIN FILM, METHOD FOR MANUFACTURING SEMICONDUCTOR DEVICE INCLUDING SAME, AND SEMICONDUCTOR MANUFACTURED THEREBY

CROSS-REFERENCE TO RELATED APPLICATIONS

This U.S. non-provisional patent application claims priority under 35 U.S.C. § 119 of Korean Patent Application No. 10-2020-0075232, filed on Jun. 19, 2020, the entire contents of which are hereby incorporated by reference.

FIELD OF THE INVENTION

The present invention disclosed herein relates to a method for forming an amorphous silicon thin film, a method for manufacturing a semiconductor device including the same, and a semiconductor device manufactured thereby.

BACKGROUND ART

Devices such as semiconductors, LCD substrates, MED substrates, and the like are manufactured by a semiconductor process including one or more deposition processes and etching processes.

For example, a substrate constituting a device may have a second amorphous silicon layer 300a, that is, an a-Si layer. Also, in order to facilitate the deposition of the a-Si layer on a substrate 100, it is preferable that a base layer of such as $SiO_2$ or SiN is first formed on the substrate, and then the a-Si layer is formed on the base layer through a PFCVD process and the like.

However, due to the difference in film quality and roughness of the SiN base layer, the adhesion state of the a-Si layer formed on the SiN base layer may be poor, and when an etching process for the a-Si layer is performed, there is a problem in that a tail phenomenon occurs in which the etching of a lower region (310a in FIG. 3) of the a-Si layer is relatively insufficient.

In order to solve the problem, the prior art additionally performs a $NH_3$ plasma treatment process before depositing a-Si on a SiN base layer.

However, there is a problem with the prior art in that due to the increase in the number of process steps caused by the performance of the $NH_3$ plasma treatment process before depositing a-Si, product productivity decreases, and due to frequent power on/off, the possibility of particle generation on an a-Si thin film increases.

SUMMARY OF THE INVENTION

To solve the above-mentioned limitations, the present invention provides a method for depositing an a-Si thin film that can stably form an a-Si layer with reduced occurrence of a tail phenomenon on a SiN thin film without additionally performing a plasma treatment process in depositing the a-Si film on the SiN thin film, and a thin film using the same.

In accordance with an embodiment of the present invention, disclosed is a method for forming an amorphous silicon thin film, wherein the method includes First step S10 of providing a first gas containing silicon and a second gas containing nitrogen on a substrate 100 to form a first amorphous silicon layer 310b, and Second step S20 of providing a first gas containing silicon on the substrate 100 having the first amorphous silicon layer 310b formed thereon to form a second amorphous silicon layer 300a.

First step S10 may be performed while decreasing the supply flow rate of the second gas in a gradual manner.

First step S10 may be performed while decreasing the supply flow rate of the second gas in a stepwise manner.

First step S10 and Second step S20 may be performed while the supply flow rate of the first gas is maintained constant.

The supply flow rate of the first gas in First step S10 and in Second step S20 may be different from each other.

The method may be performed while changing the supply flow rate of the first gas in First step S10 to an initial supply flow rate of the first gas in Second step S20.

In First step S10, an initial supply flow rate of the second gas may be 1 to 25% of an initial supply flow rate of the first gas in First step S10.

As the first gas, $SiH_4$ may be used.

The second gas may be a gas containing nitrogen.

The second gas may be at least one of $NH_3$ and $N_2$.

In accordance with another embodiment of the present invention, disclosed is a method for manufacturing a semiconductor device, wherein the method includes an amorphous silicon thin film formation step of forming an amorphous silicon thin film on the substrate 100, and an etching step of etching the amorphous silicon thin film formed on the substrate 100, wherein the amorphous silicon thin film formation step is performed by the method for forming an amorphous silicon thin film having the above configuration.

In accordance with another embodiment of the present invention, disclosed is a semiconductor device manufactured by the method for manufacturing a semiconductor device as described above.

Advantageous Effects

A method for depositing a thin film according to the present invention and a thin film using the same have advantages in that in depositing an a-Si thin film on a SiN thin film, a first step of forming a first amorphous silicon layer is performed using a first gas containing silicon such as $SiH_4$ and a second gas containing nitrogen such as $NH_3$, and then a second step of forming a second amorphous silicon layer made of such as a-Si is performed using only a gas containing silicon such as $SiH_4$, so that an a-Si layer may be formed with reduced occurrence of a tail phenomenon on the SiN thin film without additionally performing a plasma treatment process.

In addition, the method for depositing a thin film according to the present invention and the thin film using the same have advantages in that in depositing an a-Si thin film on a SiN thin film, the ratio of the supply flow rate of the first gas and the ratio of the supply flow rate of the second gas in the above-described first step may be adjusted, so that the density of a thin film formed on a substrate may be controlled. As a result, an etch rate in a lower region of the thin film is increased, thereby improving etch profile.

In addition, the method for depositing a thin film according to the present invention and the thin film using the same have advantages in that in depositing an a-Si thin film on a SiN thin film, a plasma treatment process using $NH_3$ is omitted, so that a total number of processes is reduced, thereby improving productivity.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 5 is a table showing the physical properties of an amorphous silicon thin film formed by a method for forming a thin film according to the present invention.

DETAILED DESCRIPTION OF THE PREFERRED EMBODIMENTS

Hereinafter, a method for forming an amorphous silicon thin film, a method for manufacturing a semiconductor device including the same, and a semiconductor device manufactured thereby, all according to the present invention, will be described with reference to the accompanying drawings.

The method for forming an amorphous silicon thin film according to the present invention includes First step S10 of providing a first gas containing silicon and a second gas containing nitrogen on a substrate 100 to form a first amorphous silicon layer 310b, and Second step S20 of providing a first gas containing silicon on the substrate 100 having the first amorphous silicon layer 310b formed thereon to form a second amorphous silicon layer 300a.

Here, the substrate 100 is a substrate constituting a device such as an LCD substrate, an OLED substrate, and the like manufactured through a semiconductor process, and any substrate may be used as long as it is a substrate having a SiN layer 200 formed thereon to allow an amorphous silicon thin film to be formed.

First step S10 is a step of supplying a first gas containing silicon and a second gas containing nitrogen on the substrate 100 to form the first amorphous silicon layer 310b, and may be performed by various methods.

Particularly, First step S10 may be performed by various methods according to changes in the supply flow rate of a first gas and a second gas.

Figure 1:
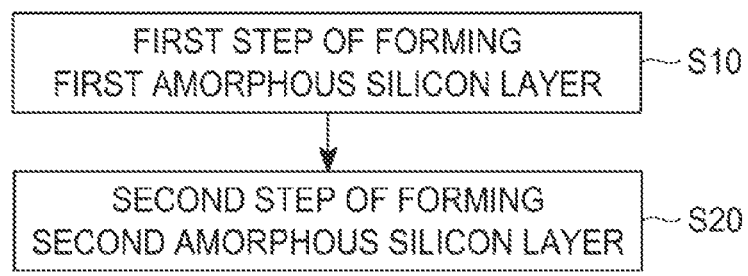
FIG. 1 is a flowchart showing a method for forming an amorphous silicon thin film according to the present invention.
Figure 2A:
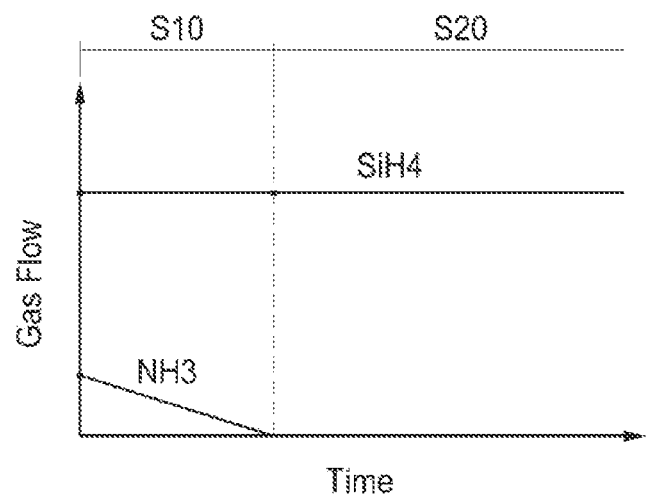
FIG. 2A is a graph showing changes in the supply flow rate of a first gas and of a second gas based on the process execution time to perform the method for forming an amorphous silicon thin film of FIG. 1.
Figure 2B:
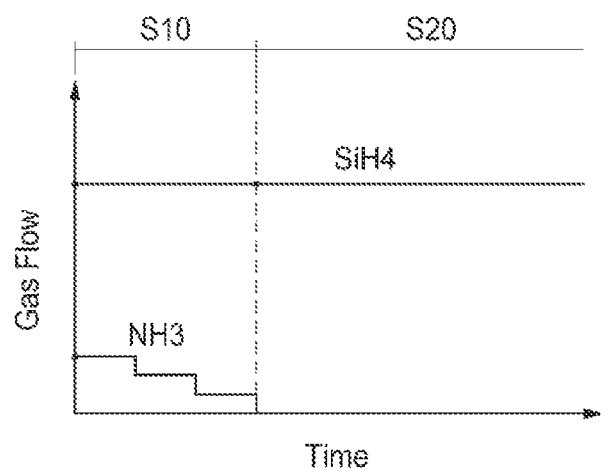
FIG. 2B is a graph showing changes in the supply flow rate of a first gas and of a second gas based on the process execution time to perform a modified example of the method for forming an amorphous silicon thin film according to FIG. 2A.
Figure 2C:
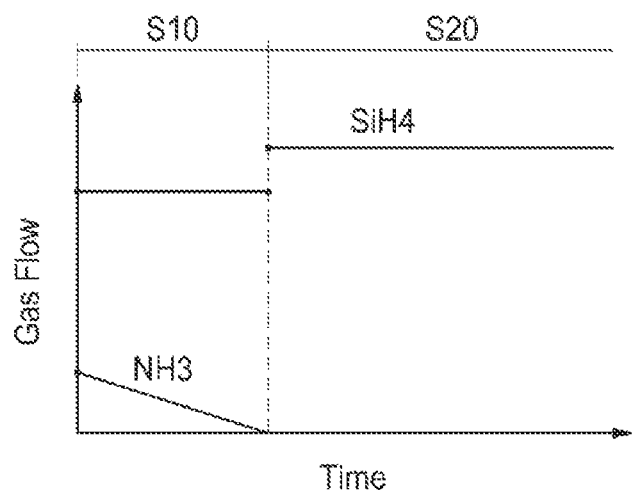
FIG. 2C is a graph showing changes in the supply flow rate of a first gas and of a second gas based on the process execution time to perform another modified example of the method for forming an amorphous silicon thin film of FIG. 2A.
Figure 2D:
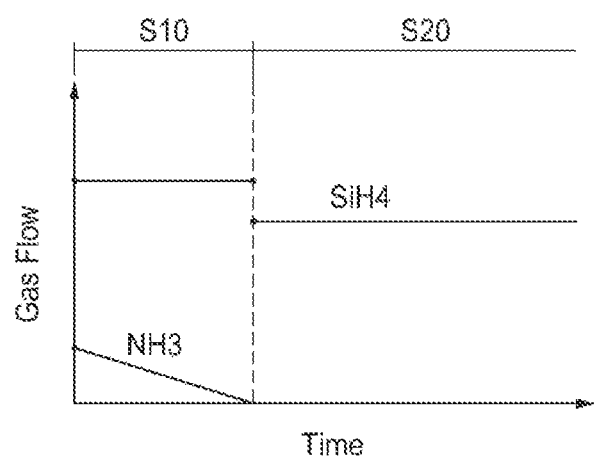
FIG. 2D is a graph showing changes in the supply flow rate of a first gas and of a second gas based on the process execution time to perform yet another modified example of the method for forming an amorphous silicon thin film of FIG. 2A.

More specifically, as shown in FIG. 2A and FIG. 2C to FIG. 2E, First step S10 may be performed while decreasing the supply flow rate of a second gas in a gradual manner, and as shown in FIG. 2B, First step S10 may be performed while decreasing the supply flow rate of a second gas in a stepwise manner.

That is, First step S10 may be performed such that an initial supply flow rate of a second gas is decreased from a preset value in a continuous manner or stepwise manner, so that the supply of the second gas is stopped before Second step S20 to be described later is performed.

Here, First step S10 may be performed such that the initial supply flow rate of a second gas is gradually decreased from 1% to 25%, preferably 5% to 10%, of an initial supply flow rate of a first gas in First step S10, so that the initial supply flow rate of the second gas becomes 0% before Second step S20 to be described above is performed.

Meanwhile, the supply flow rate of a first gas in First step S10 and in Second step S20 may be variously changed.

Specifically, as shown in FIG. 2A to FIG. 2D, First step S10 and Second step S20 may be performed while the supply flow rate of a first gas is maintained constant.

At this time, the supply flow rate of a first gas in First step S10 may be set to be the same as, or greater or less than the supply flow rate of a first gas in Second step S20. That is, the supply flow rate of a first gas in First step S10 and the supply flow rate of a first gas in Second step S20 may be set to be different from each other.

Figure 2E:
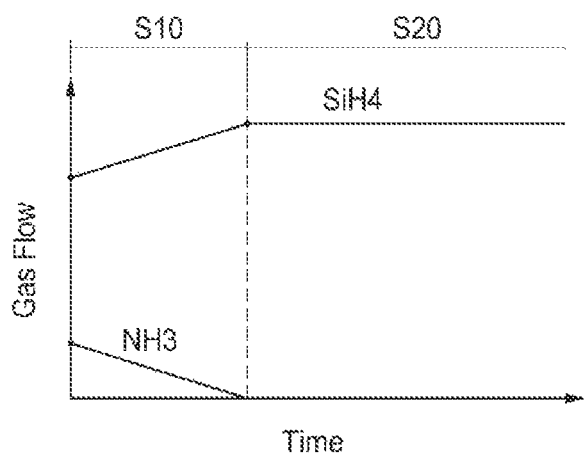
FIG. 2E is a graph showing changes in the supply flow rate of a first gas and of a second gas based on the process execution time to perform still yet another modified example of the method for forming an amorphous silicon thin film according to FIG. 2A.

In addition, as shown in FIG. 2E, the supply flow rate of a first gas in First step S10 and the supply flow rate of a first gas in Second step S20 may be decreased or increased in a continuous manner or in a stepwise manner with respect to time.

Here, the supply flow rate of a first gas in First step S10 may be changed to an initial supply flow rate of a first gas in Second step S20.

Meanwhile, the first gas is a gas containing silicon, and $SiH_4$ and the like may be used.

Also, the second gas is a gas containing nitrogen, and $NH_3$, $N_2$, or the like may be used.

Meanwhile, in supplying a first gas containing silicon and a second gas containing nitrogen on the substrate 100 to form the first amorphous silicon layer 310b, First step S10 may be performed by a CVD process, preferably a PECVD process.

Second step S20 is a step of providing a first gas containing silicon on the substrate 100 having the first amorphous silicon layer 310b formed thereon to form the second amorphous silicon layer 300a, and may be performed by various methods.

Here, it is preferable that the above first gas is the same gas as the first gas in First step S10. However, it should be understood that a different type of gas from the first gas in First step S10 may be used.

Also, in providing a first gas containing silicon on the substrate 100 having the first amorphous silicon layer 310b formed thereon to form the second amorphous silicon layer 300a, Second step S20 and may be performed a CVD process, preferably a PECVD process.

In the PECVD process, an RF generator of different types of plasma, such as VHF, HE and LF, may be used.

Here, Second step S20 is a continuous process of First step S10, and is preferably performed in a sing process module, but is not limited thereto.

Meanwhile, the execution time of Second step S20 and the execution time of First step S10 may be variously set according to the thickness of the first amorphous silicon layer 310b and the second amorphous silicon layer 300a.

In the method for forming an amorphous silicon thin film according to the present invention with the above configuration, an initially formed thin film by the performance of First step S10 includes a-Si doped with nitrogen (N).

Also, due to the decrease in the supply flow rate of the second gas, the doping amount of nitrogen (N) decreases from a lower portion toward an upper portion, so that the physical properties of a-Si not doped with nitrogen (N) are achieved by the performance of Second step S20.

Figure 3:
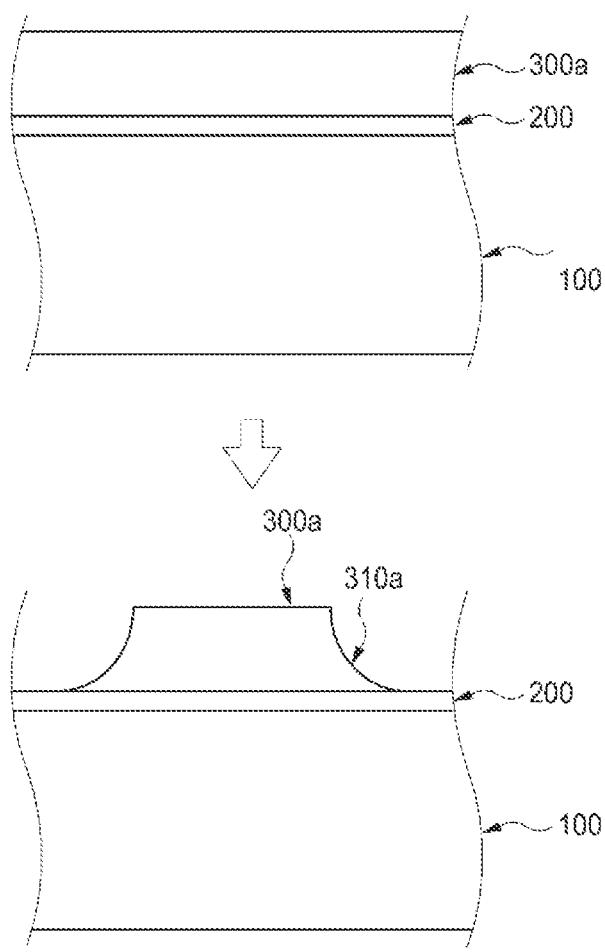
FIG. 3 is a view showing a state in which an amorphous silicon thin film is formed according to a typical thin film formation method, and a state after an etching process is performed on the amorphous silicon thin film.
Figure 4:
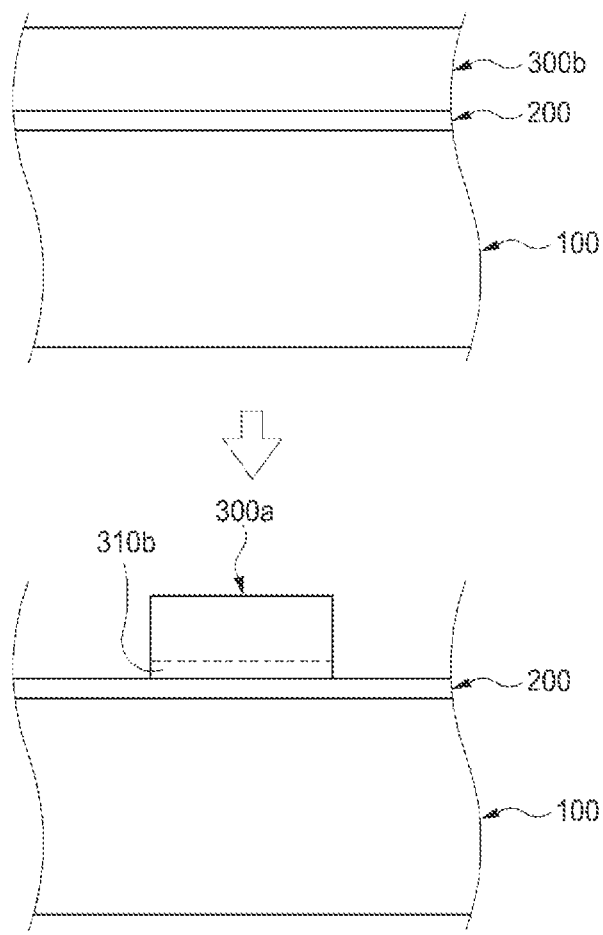
FIG. 4 is a view showing a state in which an amorphous silicon thin film is formed according to a method for forming an amorphous silicon thin film according to the present invention, and a state after an etching process is performed on the amorphous silicon thin film.

Meanwhile, a thin film formed by the method for forming an amorphous silicon thin film according to the present invention described as above has a-Si doped with nitrogen (N) formed on a lower portion thereof, so that it has been confirmed through an experiment that when a subsequent etching process, that is, an etching process is performed thereon, a tail phenomenon occurring when a typical thin film formation method is performed as shown in FIG. 3 is reduced as shown in FIG. 4.

Specifically, in the case of a thin film formed by the method for forming an amorphous silicon thin film according to the present invention, as shown in FIG. 5, it was confirmed that as the ratio of second gas ($NH_3$)/first gas ($SiH_4$) increased with respect to the physical properties (the ratio of second gas ($NH_3$)/first gas ($SiH_4$) is 0% in FIG. 5) of a thin film formed by a typical thin film formation method, a refractive index (R.I.) decreased. Through the above, it was confirmed that as the ratio of second gas ($NH_3$)/first gas ($SiH_4$) increased, density decreased.

That is, in the case of a thin film formed by the method for forming an amorphous silicon thin film according to the present invention, it can be seen that as the amount of second gas ($NH_3$)/first gas ($SiH_4$) decreases from a lower film to an upper film, the density of the thin film gradually increases, and that the lower film is a film having a relatively low density.

In summary, as shown in FIG. 4, in the case of a thin film formed by the method for forming an amorphous silicon thin film according to the present invention, while an a-Si thin film having a desired density overall is formed, a lower layer of the a-Si thin film 300b doped with nitrogen (N) has a relatively low density, so that a tail is to prevented from being formed at the edge of the lower layer during an etching process.

Meanwhile, it has been confirmed through an experiment that even when a thin film is formed by the method for forming an amorphous silicon thin film according to the present invention, the structure of the amorphous silicon thin film is not affected.

Figure 6:
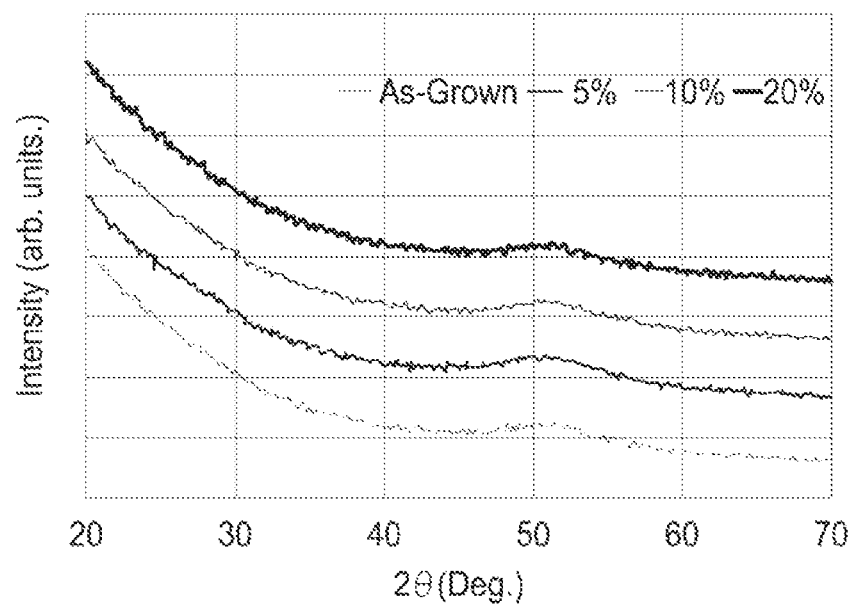
FIG. 6 is a graph showing the crystal structure of an amorphous silicon thin film formed according to a method for forming a thin film according to the present invention.

Specifically, as shown in FIG. 6, through the X-Ray Diffraction (XRD) analysis of thin films formed by the method for forming an amorphous silicon thin film according to the present invention, it was confirmed that the graph patterns of thin films (5%, 10%, and 20%) doped with nitrogen were the same as the graph pattern of a thin film (As Grown) not doped with nitrogen is not doped. Therefore, it was confirmed that there was no significant change between the physical properties of the thin films formed by the method for forming an amorphous silicon thin film according to the present invention and the physical properties of a thin film formed by a typical thin film formation method.

Particularly, the positions of peaks in the XRD graph patterns were not changed even when the ratio of second gas ($NH_3$)/first gas ($SiH_4$) increased with respect to the physical properties (the ratio of second gas ($NH_3$)/first gas ($SiH_4$) is 0% in FIG. 5) of the thin film formed by a typical thin film formation method, so that it was confirmed that there was no change in the structures of the thin films since, so that there was no change in the physical properties thereof.

That is, since the structure of an improved amorphous silicon formed by the method of forming an amorphous silicon thin film according to the present invention and the structure of a thin film performed by a typical method of forming a thin film are not different, when forming an amorphous silicon thin film, the typical method for forming a thin film may be replaced by the method for forming an amorphous silicon thin film according to the present invention to form an a-Si thin.

Meanwhile, the method for forming an amorphous silicon thin n according to the present invention may be implemented as a method for manufacturing a semiconductor device with the addition of an etching process.

That is, a method for manufacturing a semiconductor device according to the present invention is a method for manufacturing a semiconductor device including an amorphous silicon thin film formation step of forming an amorphous silicon thin film on the substrate 100, and an etching step of etching the amorphous silicon thin film formed on the substrate 100, wherein the amorphous silicon thin film formation step may be performed by the method for forming an amorphous silicon thin film.

The etching process is a step of etching the amorphous silicon thin film formed on the substrate 100, and may be performed by various methods.

Meanwhile, provided is a device manufactured by the method for forming an amorphous silicon thin film according to the present invention, that is, the method for manufacturing a semiconductor device.

Particularly, the device may have a thin film formed by the method for forming an amorphous silicon thin film according to the present invention as part of a semiconductor process.

The above description is merely illustrative of some of preferred embodiments that may be implemented by the present invention. Therefore, as well noted, it should be understood that the scope of the present invention should not be construed as being limited to the above-described embodiment. Both the technical spirit of the present invention described above and the technical spirit sharing the fundamentals thereof will all be included in the scope of the present invention.

What is claimed is:

1. A method for forming an amorphous silicon thin film, the method comprising:
    a first step (S10) of providing a first gas containing silicon and a second gas containing nitrogen on a substrate (100) to form a first amorphous silicon layer (310b); and
    a second step (S20) of providing the first gas containing silicon on the substrate (100) having the first amorphous silicon layer (310b) formed thereon to form a second amorphous silicon layer (300a), wherein a supply flow rate of the first gas in the first step (S10) and a supply flow rate of the first gas in the second step (S20) are different from each other, wherein the method is performed while changing the supply flow rate of the first gas in the first step (S10) to an initial supply flow rate of the first gas in the second step (S20).

2. The method of claim 1, wherein the first step (S10) is performed while gradually decreasing a supply flow rate of the second gas in a gradual manner.

3. The method of claim 1, wherein the first step (S10) is performed while decreasing a supply flow rate of the second gas in a stepwise manner.

4. The method of claim 1, wherein an initial supply flow rate of the second gas in the first step (S10) is 1 to 25% of an initial supply flow rate of the first gas in the first step (S10).

5. The method of claim 1, wherein the first gas is $SiH_4$.

6. The method of claim 1, wherein the second gas is at least one of $NH_3$ and $N_2$.

7. A method for manufacturing a semiconductor device, the method comprising:
   an amorphous silicon thin film formation step of forming an amorphous silicon thin film on a substrate (100); and
   an etching step of etching the amorphous silicon thin film formed on the substrate (100), wherein the amorphous silicon thin film formation step further comprises:
   a first step (S10) of providing a first gas containing silicon and a second gas containing nitrogen on the substrate (100) to form a first amorphous silicon layer (310b); and
   a second step (S20) of providing the first gas containing silicon on the substrate (100) having the first amorphous silicon layer (310b) formed thereon to form a second amorphous silicon layer (300a),
   wherein a supply flow rate of the first gas in the first step (S10) and a supply flow rate of the first gas in the second step (S20) are different from each other,
   wherein the method is performed while changing the supply flow rate of the first gas in the first step (S10) to an initial supply flow rate of the first gas in the second step (S20).

8. A semiconductor device manufactured by the method for manufacturing a semiconductor device according to claim 7.

* * * * *